(12) United States Patent
Schnell et al.

(10) Patent No.: US 10,895,614 B2
(45) Date of Patent: Jan. 19, 2021

(54) CLOSELY-FITTING LOCAL COIL ARRAY FOR MAGNETIC RESONANCE APPLICATIONS

(71) Applicant: Siemens Healthcare GmbH, Erlangen (DE)

(72) Inventors: Wilfried Schnell, Forchheim (DE); Yvonne Candidus, Fürth (DE); Thomas Kundner, Buckenhof (DE); Wolfgang Kraus, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 115 days.

(21) Appl. No.: 16/186,952

(22) Filed: Nov. 12, 2018

(65) Prior Publication Data

US 2019/0162800 A1 May 30, 2019

(30) Foreign Application Priority Data

Nov. 24, 2017 (DE) .......................... 10 2017 221 036

(51) Int. Cl.
*G01R 33/34* (2006.01)
*G01R 33/3415* (2006.01)

(52) U.S. Cl.
CPC ... *G01R 33/3415* (2013.01); *G01R 33/34007* (2013.01); *G01R 33/34084* (2013.01)

(58) Field of Classification Search
CPC .......... G01R 33/3415; G01R 33/34007; G01R 33/34084

(Continued)

(56) References Cited

U.S. PATENT DOCUMENTS

| 5,594,339 A | 1/1997 | Henderson et al. |
| 2008/0106262 A1* | 5/2008 | Ohsawa ........... G01R 33/34007 324/318 |

(Continued)

FOREIGN PATENT DOCUMENTS

| DE | 102011076119 A1 | 11/2012 |
| DE | 102013216861 A1 | 2/2015 |
| DE | 102015210529 A1 | 12/2016 |

OTHER PUBLICATIONS

German Research Report for German Application No. 10 2017 221 036.2, dated Aug. 27, 2018.

*Primary Examiner* — Dixomara Vargas
*Assistant Examiner* — Courtney G McDonnough
(74) *Attorney, Agent, or Firm* — Lempia Summerfield Katz LLC

(57) ABSTRACT

A local coil array for magnetic resonance applications has a mechanical structure in which a plurality of local coils of the local coil array are arranged. The mechanical structure has base elements and connecting elements. In each case, two of the base elements are connected to one other via at least one connecting element such that, to a limited extent, a translational and/or rotational movement of the base elements relative to one other is possible. The connection of the base elements to the connecting elements is configured such that the connecting elements either do not oppose the movement of the base elements relative to one another or only employ such a low counterforce that when the mechanical structure is placed on a patient from above, the base elements come to rest on the patient while moving relative to one another. At least some of the base elements contain at least a part of one of the local coils of the local coil array.

19 Claims, 5 Drawing Sheets

(58) Field of Classification Search
USPC .......................................................... 324/322
See application file for complete search history.

(56) References Cited

U.S. PATENT DOCUMENTS

| | | | |
|---|---|---|---|
| 2010/0156421 A1* | 6/2010 | Sukkau | G01R 33/3415 |
| | | | 324/318 |
| 2012/0293176 A1 | 11/2012 | Zink | |
| 2013/0137969 A1* | 5/2013 | Jones | A61B 5/055 |
| | | | 600/421 |
| 2015/0057528 A1 | 2/2015 | Driemel | |
| 2016/0363642 A1 | 12/2016 | Gall | |
| 2017/0248666 A1 | 8/2017 | Rothgang et al. | |

* cited by examiner

CLOSELY-FITTING LOCAL COIL ARRAY FOR MAGNETIC RESONANCE APPLICATIONS The application claims the benefit of German Patent Application No. DE 10 2017 221 036.2, filed Nov. 24, 2017, which is hereby incorporated by reference in its entirety.

TECHNICAL FIELD

The present disclosure relates to a local coil array for magnetic resonance applications, wherein the local coil array has a mechanical structure in which a plurality of local coils of the local coil array are arranged.

BACKGROUND

Such local coil arrays are generally known. Local coils are used in the medical field, in particular in magnetic resonance tomography, in order to be able to detect an image of a patient that is as complete as possible. In order to achieve the highest possible signal-to-noise ratio (SNR), the local coils are arranged as closely as possible to the patient.

In the prior art, local coils are known which may be adapted with regard to their size or shape. For example, in German Patent Publication No. DE 10 2013 216 861 A1, a head/neck local coil is described with a size-adjustable neck region. German Patent Publication No. DE 10 2011 076 119 B4 discloses an adjustable local coil with rotatable elements. German Patent Publication No. DE 10 2015 210 529 A1 describes a local coil having an expandable support structure.

In other cases, local coil arrays are embedded in a flexible printed circuit board, which in turn is surrounded by foam. The foam serves, on the one hand, to protect the local coils from damage and, on the other hand, to protect the patient from thermal overload or local specific absorption rate (SAR). The foam also gives the local coil array a certain stability. Such a local coil array may be configured to the individual body size and body shape of the patient. For this purpose, however, the application of external forces is necessary in order to overcome the inherent stability of the foam. The external forces may be applied by belts.

Recently, there have also been solutions with highly flexible and very lightweight constructions. In this case too, however, no independent molding to the patient takes place.

SUMMARY AND DESCRIPTION

The scope of the present disclosure is defined solely by the appended claims and is not affected to any degree by the statements within this description. The present embodiments may obviate one or more of the drawbacks or limitations in the related art.

The object of the present disclosure is to create a local coil array for magnetic resonance applications which molds itself to the patient of its own accord and remains in this shape during the magnetic resonance examination without having to be fixed with belts or other fastening elements.

According to an embodiment, a local coil array is configured such that the mechanical structure has base elements and connecting elements. In each case, two of the base elements are connected to one another via at least one connecting element in such a way that a translational and/or rotational movement of the base elements relative to one another is possible to a limited extent. The connection of the base elements to the connecting elements is configured in such a manner that the connecting elements either do not oppose the movement of the base elements relative to one another or only employ such a low counterforce that when the mechanical structure is placed on a patient from above, the base elements come to rest on the patient while moving relative to one another. At least some of the base elements respectively contain at least a part of one of the local coils of the local coil array.

At least one of the local coils may be arranged in a single one of the base elements. In this case, the other local coils are also each arranged in a single one of the base elements. In this case, the connecting elements may be restricted to their purely mechanical function and may be optimized.

Furthermore, at least one of the local coils may be arranged in at least two of the base elements and the connecting elements connecting these base elements to one another. In this case, the other local coils are also each arranged in at least two of the base elements and the connecting elements connecting these base elements to one another. This embodiment is realized as an alternative to an arrangement of at least one of the local coils in a single one of the base elements. In this case, a particularly good degree of overlap of the local coils may be achieved, in particular in a simple manner.

In particular, if the local coils extend over base elements and connecting elements, the base elements and the connecting elements may be matched to one another in such a way that a maximum distance between adjacent base elements from one other is at most 10 mm, a maximum of 8 mm, or a maximum of 5 mm. As a result, electrical clearances from the patient may be maintained in a particularly simple manner. "Adjacent" in this context refers to two base elements that are directly connected to one another by way of connecting elements.

The base elements may be designed as required. For example, the base elements may be configured as flat elements with abutting edges which adjoin one another at their abutting edges, such that each base element has at least one abutting edge which is directly opposite an abutting edge of another base element. The term "directly" in this context is intended to mean that there is no lateral offset of the abutting edge of the one base element to the abutting edge of the other base element.

When abutting edges of base elements are directly opposite each other, a particular embodiment includes therein that: the base elements form a plurality of rows; the rows each extend in a row direction which is uniform for the rows; within the respective row, the base elements are arranged without lateral offset transversely to the row direction and are only spaced apart from one another by some of the connecting elements; the base elements are either arranged opposite one another from row to row without an offset in the row direction or with an offset in the gap; and viewed from row to row, the base elements are spaced apart from one another by a further portion of the connecting elements.

Alternatively, in one embodiment, the base elements form a plurality of rows; the rows each extend in a row direction which is uniform for the rows; within the respective row, the base elements are arranged without lateral offset transversely to the row direction and are spaced at a distance from one another which is greater than a longitudinal extension of the base elements in the row direction; the base elements of adjacent rows are arranged in the row direction with an offset in the gap; viewed transversely to the row direction, the rows are at a distance from the respective next row but one, which is smaller than a transverse extension of the base elements transversely to the row direction; and the connecting elements each connect base elements of adjacent rows to one another.

This embodiment particularly offers the advantage that gaps may remain between the base elements which may be used as access to the patient. The circulation of air is also improved, enabling sweat secreted by the patient to evaporate more easily.

The base elements may be inherently stable or rigid as required, have a foam casing, and/or be configured as flexible covers filled with a gel or a liquid. The same applies to the connecting elements. In particular, when the base elements and/or the connecting elements themselves are not completely rigid, they may also mold themselves to the body of the patient to a certain degree.

The base elements may include a transparent material. The same applies to the connecting elements.

In the case of an embodiment with a transparent material, light-emitting diodes may be embedded in the base elements and/or in the connecting elements.

The number of local coils may be in a range of 4 and 80 local coils, or in a range of 6 and 50 local coils.

The number of base elements may be at least 8 base elements, at least 20 base elements, or at least 30 base elements.

BRIEF DESCRIPTION OF THE DRAWINGS

The aforementioned properties, features, and advantages of this disclosure, as well as the manner in which they are achieved, will become clearer and more readily comprehensible in connection with the following description of the exemplary embodiments which are explained in more detail in connection with the following figures.

DETAILED DESCRIPTION

The local coil arrays of FIGS. 1 to 4 will first be explained together hereinafter. Subsequently, the differences of the local coil arrays of FIGS. 1 to 4 will be discussed.

According to FIGS. 1 to 4, the local coil arrays have one mechanical structure 1 each. The mechanical structure 1 serves as a mechanical support for local coils 2 of the local coil array. The local coils 2 are therefore arranged in the mechanical structure 1.

The mechanical structure 1 has base elements 3. The base elements 3 may be rectangular in design in the plan view. However, the base elements 3 may alternatively have a different shape from a rectangle. For example, in the plan view, the base elements 3 may be in the shape of a regular hexagon, (e.g., the shape of a honeycomb).

Figure 3:
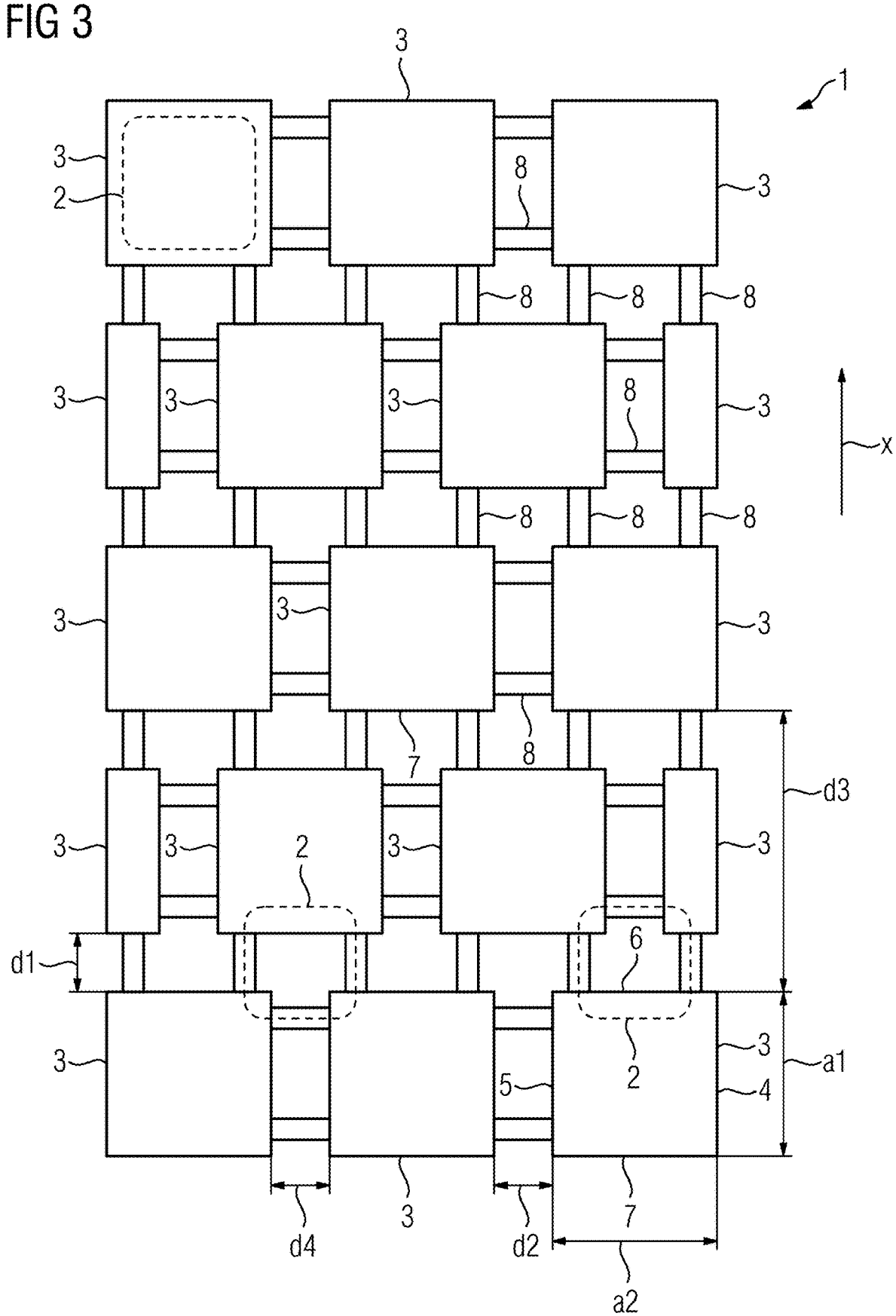
FIG. 3 depicts an example of a plan view of a third local coil array.
Figure 4:
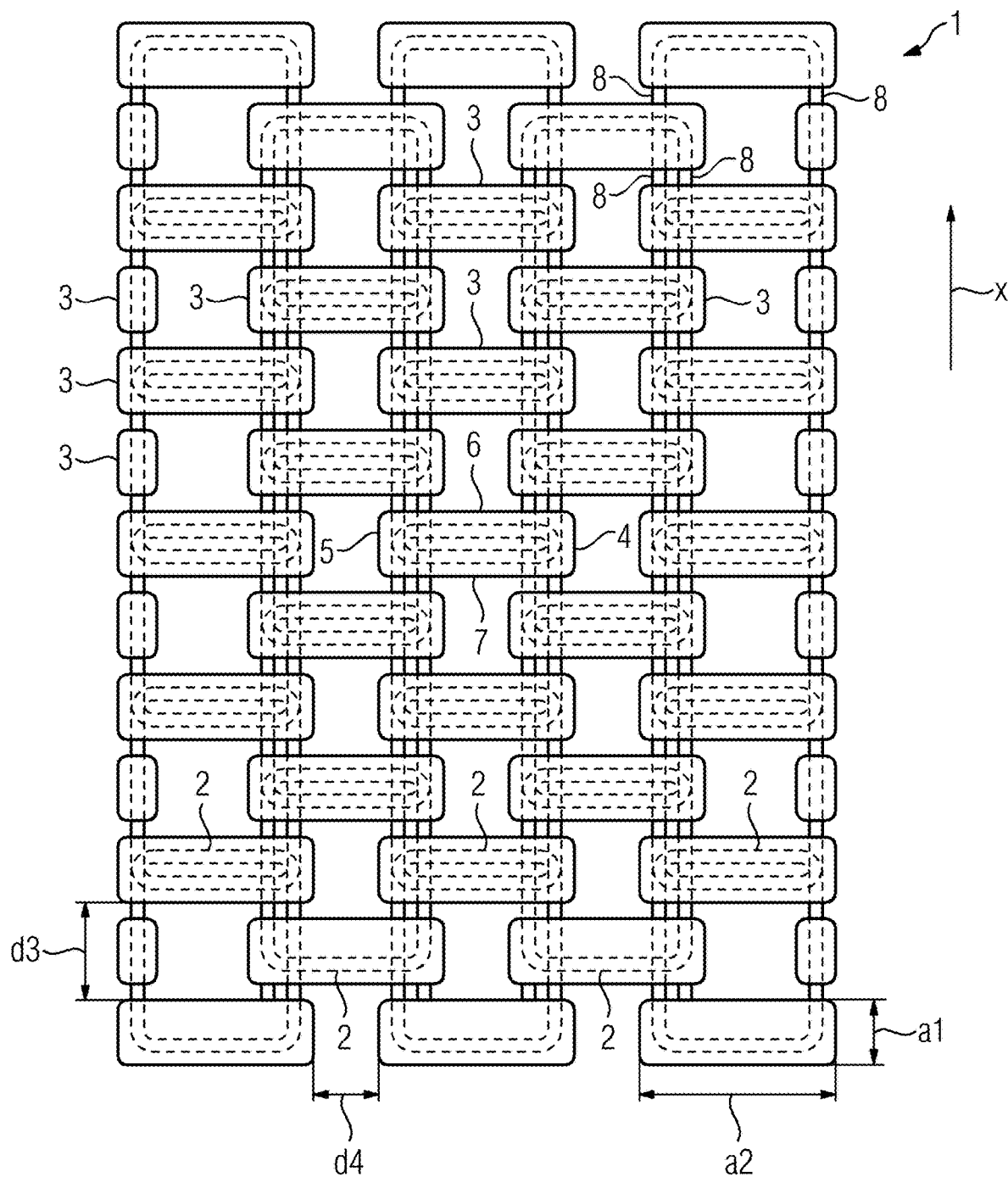
FIG. 4 depicts an example of a plan view of a fourth local coil array.

In the case of a rectangular embodiment of the base elements 3, abutting edges 4, 5 of the base elements 3 opposite one another have a longitudinal extension a1, the two other abutting edges 6, 7 have a transverse extension a2. In FIGS. 1 to 4, the abutting edges 4 to 7 as well as the longitudinal extension a1 and the transverse extension a2 are only shown for one of the base elements 3 in each case. The longitudinal extension a1 and the transverse extension a2 may have the same value for all the base elements 3. The base elements 3 arranged at the edge of the mechanical structure 1 may, however, be smaller in size, as shown in FIGS. 2 to 4, in order to maintain a uniform overall length and/or overall width of the mechanical structure. The longitudinal extension a1 and the transverse extension a2 may have the same value or different values from one another.

The mechanical structure 1 also has connecting elements 8. In each case, two of the base elements 3 are connected to one another via at least one of the connecting elements 8. The respective connection of the base elements 3 is a loose connection. The base elements 3 may therefore move in a translational and/or rotatory manner relative to one another to a limited extent. In FIGS. 1 to 4, only some of the connecting elements 8 have their reference characters in order to avoid complicating FIGS. 1 to 4 unnecessarily.

Figure 5:
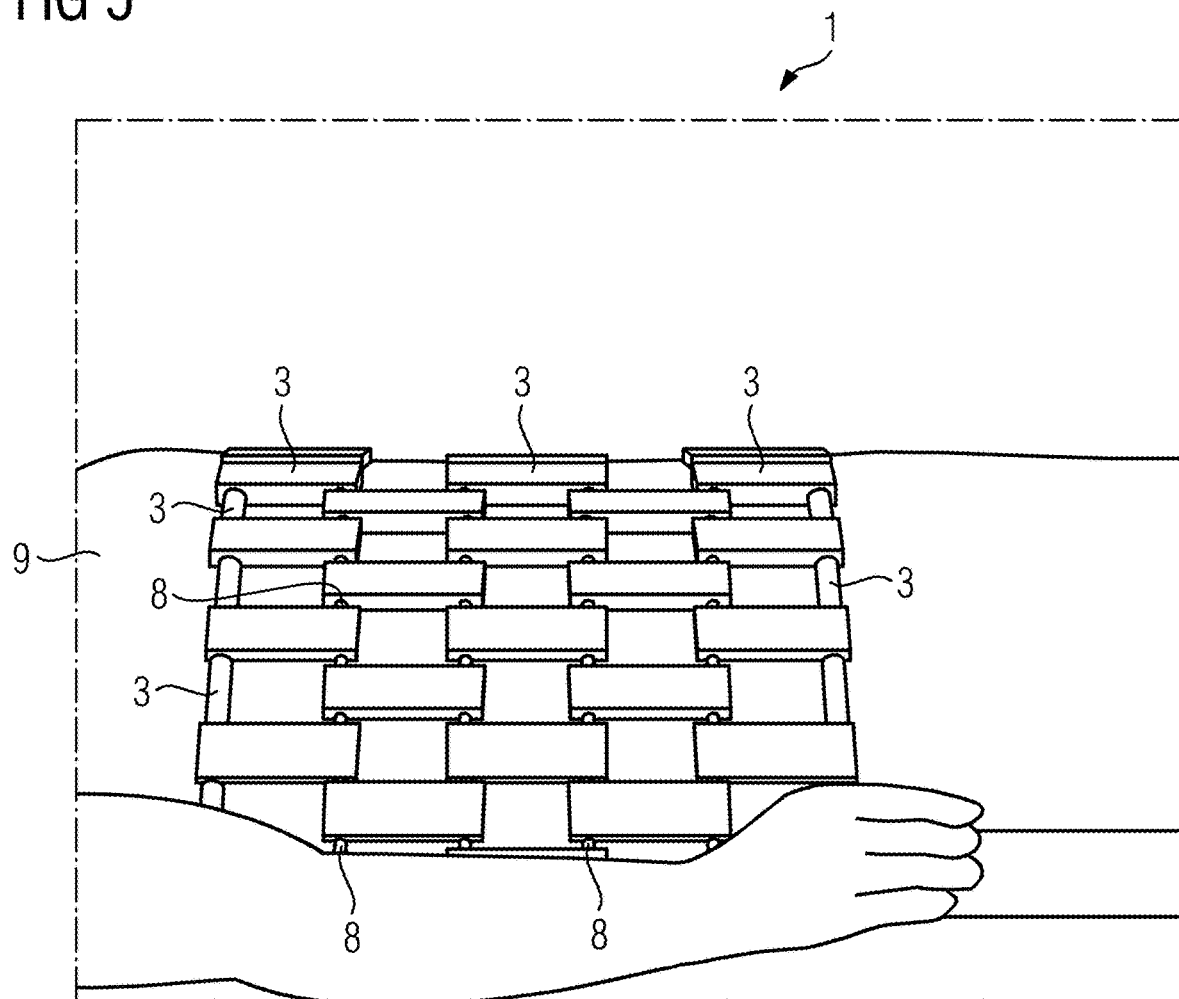
FIG. 5 depicts an example of a perspective view of a patient and a local coil array.

The connection of the base elements 3 to the connecting elements 8 is configured in such a manner that the connecting elements 8 either do not oppose the movement of the base elements 3 relative to one another or only employ a very slight counterforce. In this way, when the mechanical structure 1 is placed on a patient 9 from above (see FIG. 5), the base elements 3 come to rest on the patient 9. If necessary, the base elements 3 move relative to one another.

The mobility of the base elements 3 relative to one other may be realized, for example, by the connecting elements 8 being inherently stable or stiff but being mobile relative to the base elements 3. Furthermore, mobility may also be realized by the connecting elements 8 including an elastic material and thus having an inherent stability but being dimensioned weakly enough to yield easily. The connecting elements 8 may furthermore have a foam casing as required and/or be configured as flexible covers filled with a gel or a liquid. Mobility may be limited, for example, by the length of the connecting elements 8 and/or the interaction of stops between the base elements 3 and the connecting elements 8. In the simplest case, the connecting elements 8 are simple cords, if necessary, containing thin cables or individual wires of a cable in their interior.

Like the connecting elements 8, the base elements 3 may also be inherently stable or rigid, have a foam casing, and/or be configured as flexible covers filled with a gel or a liquid. Corresponding embodiments are generally known to those skilled in the art.

Figure 1:
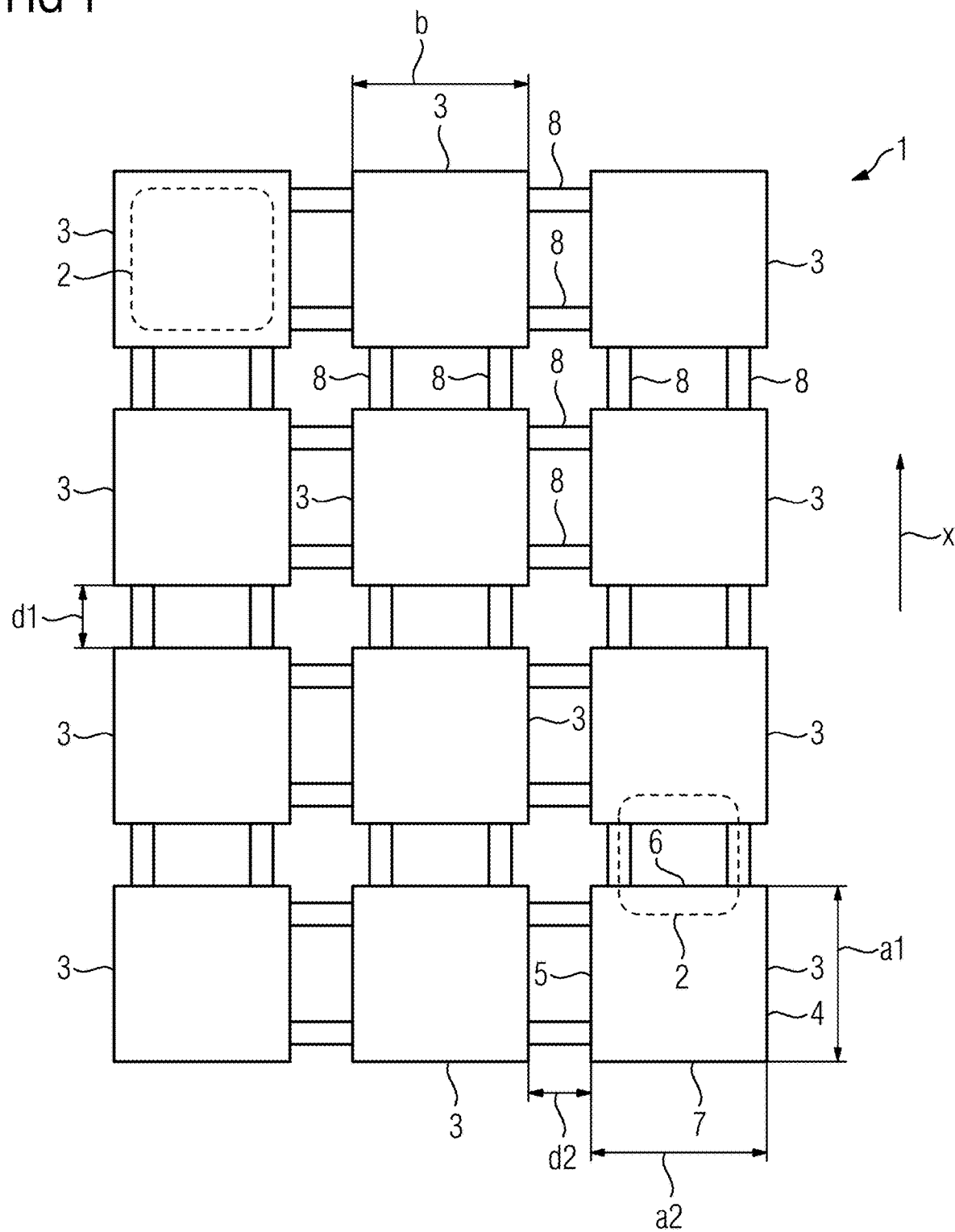
FIG. 1 depicts an example of a plan view of a first local coil array.
Figure 2:
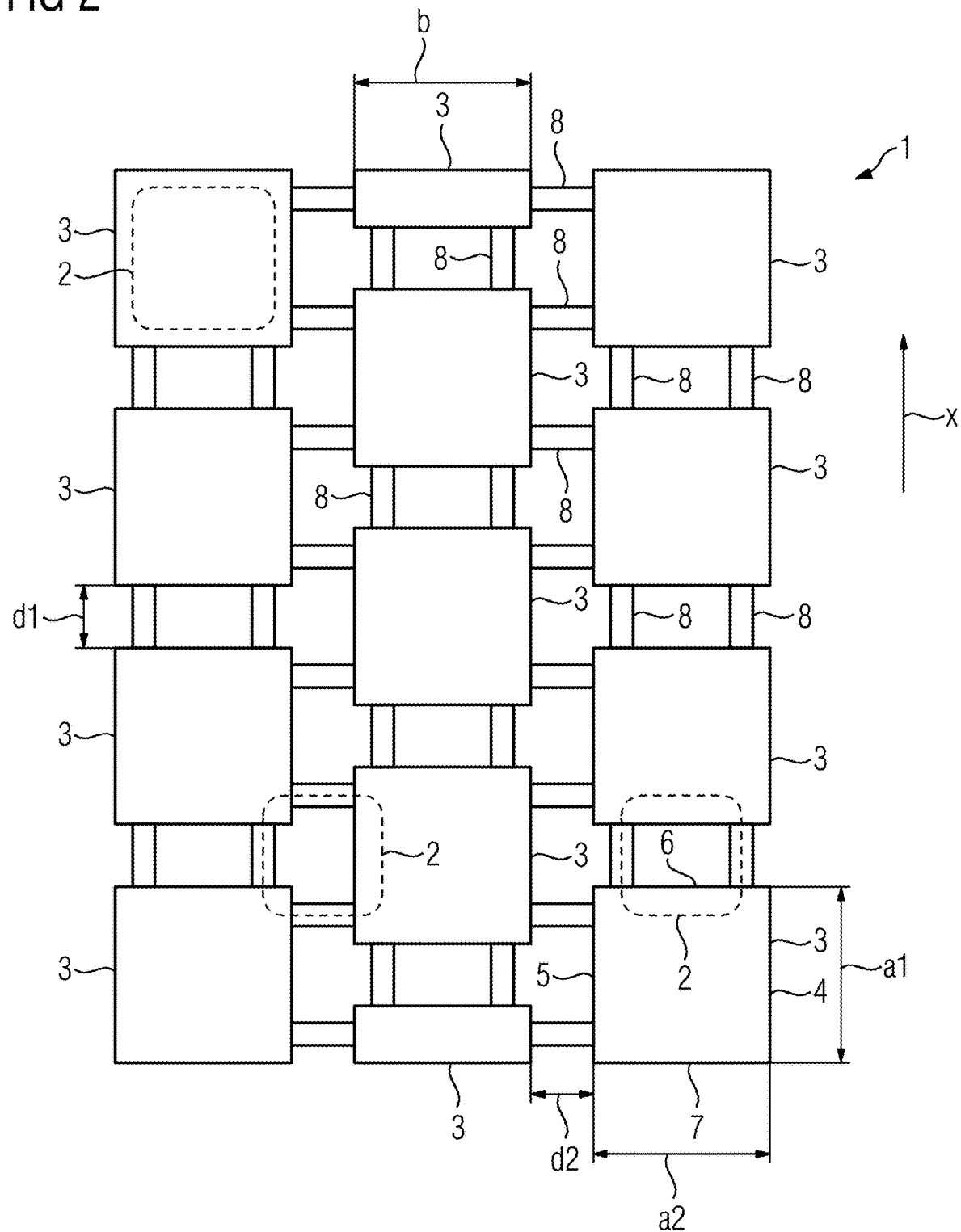
FIG. 2 depicts an example of a plan view of a second local coil array.

Within the scope of the embodiments of FIGS. 1 and 2, the base elements 3 are configured as flat elements. The base elements 3 are adjacent to one other at their abutting edges 4 to 7. Thus, in these embodiments each base element 3 has at least one abutting edge 4 to 7 which is directly opposite an abutting edge 4 to 7 of another base element 3. In this context, the term "are adjacent to one other" is not meant in the sense that the base elements 3 are adjacent to one other without any clearance. However, it is meant in the sense that the abutting edges 4 to 7 are only separated from one another or spaced apart by the connecting elements 8.

According to FIGS. 1 to 4, the base elements 3 form a plurality of rows. However, this is not an absolute necessity in the embodiments of FIGS. 1 and 2.

If the base elements form a plurality of rows, the rows each extend in a row direction x which is uniform for the rows. Within the respective row, the base elements 3 are arranged transversely to the row direction x without lateral offset. A width b of the rows thus corresponds to the transverse extension a2 of the base elements 3. In the row direction x, the base elements 3 of the next respective base element 3 of the same row are only spaced apart from one another by the connecting elements 8 located there. The base elements 3 and the connecting elements 8 may be matched to one another in such a way that a maximum distance d1 of adjacent base elements 3 of the same row from one another is at most 10 mm. The maximum distance d1 in row direction x may be at most 8 mm, or, in certain embodiments, at most 5 mm.

Viewed from row to row, the base elements 3 are likewise only spaced apart from one another by the connecting elements 8 located there. Here, too, the base elements 3 and the connecting elements 8 may be matched to one another in such a way that a maximum distance d2 of the base elements 3 of adjacent rows from one another is at most 10 mm. The maximum distance d2 may be at most 8 mm or at most 5 mm. The maximum distance d2 transversely to the row direction x may be equal to the maximum distance d1.

From row to row, the base elements 3 may be opposite one another in the row direction x without an offset as shown in FIG. 1. In this case, the base elements 3 form a rectangular grid. Alternatively, the base elements 3 may be arranged from row to row with an offset in the gap as shown in FIG. 2.

In the embodiment of FIGS. 3 and 4, the base elements 3 are also configured as flat elements which are adjacent to one other at their abutting edges 4 to 7. A difference between FIGS. 3 and 4 is that in the embodiment according to FIG. 3, the longitudinal extension a1 and the transverse extension a2 are at least the same size, while in the embodiment according to FIG. 4, the transverse extension a2 is appreciably larger than the longitudinal extension a1, e.g., at least twice as large, or up to five times as large. In most cases, a ratio of the transverse extension a2 to the longitudinal extension a1 is between 2.5:1 and 4:1, or between 3.0:1 and 3.5:1.

In the embodiment according to FIGS. 3 and 4, the base elements 3 also form a plurality of rows. As before, the rows extend in a row direction x which is uniform for the rows. In the embodiments according to FIGS. 3 and 4, the base elements 3 are also arranged without lateral offset transversely to the row direction x, as in the embodiments according to FIGS. 1 and 2, within the respective row. However, they are at a distance d3 from one another, which is greater than the longitudinal extension a1 of the base elements 3. Furthermore, the base elements 3 of adjacent rows are arranged with an offset in the gap when viewed in the row direction. In conjunction with the distance d3, it is thus possible, viewed transversely to the row direction x, that the rows are at a distance d4 from the next respective row but one which is smaller than the transverse extension a2 of the base elements 3. In this case, the connecting elements 8 connect base elements 3 of adjacent rows—that is to say, not of the next row but one—to one another in each case.

In the embodiment according to FIGS. 3 and 4, the base elements 3 and the connecting elements 8 may be matched to one another in such a way that a maximum distance d1 of adjacent base elements 3 from one another is at most 10 mm. The maximum distance d1 may be at most 8 mm or at most 5 mm. The same applies to the maximum distance d2.

At least some of the base elements 3 each contain at least part of one of the local coils 2. This applies even to all basic elements 3. Here, various embodiments are possible.

For example, it is possible that at least one of the local coils 2 is arranged in a single one of the base elements 3. This is shown at the top left in FIGS. 1 to 3 respectively for the base element 3. However, the same embodiment is also possible with the other base elements 3. In FIG. 4, this is not shown for reasons of clarity.

It is also possible that at least one of the local coils 2 is arranged in at least two of the base elements 3 and the connecting elements 8 connecting these base elements 3 to one another. This is illustrated in FIGS. 1 to 3 for the base element 3 at the bottom right and the base element 3 and/or the base elements 3 directly above it. Furthermore, this is illustrated in FIGS. 2 and 3 for the base element 3 at the bottom left and base elements 3 adjoining said base element 3. In FIG. 4, this is illustrated for a plurality of base elements 3.

The other local coils 2 of FIGS. 1 to 3 may realize one or the other of the above two embodiments as needed. In FIGS. 1 to 3 this is not included for reasons of clarity. Furthermore, in the embodiment according to FIG. 4, it is also possible that local coils 2 which are each only arranged in a single one of the base elements 3 are present.

The number of base elements 3 may be determined as required. As a rule, however, the number is at least 8 base elements. The number of base elements may be considerably larger, for example, at least 20 base elements or at least 30 base elements.

In an analogous manner, the number of local coils 2 may also be determined as required. The number of local coils may be in a range of 4 and 80 local coils, or in a range of 6 and 50 local coils.

Figure 6:
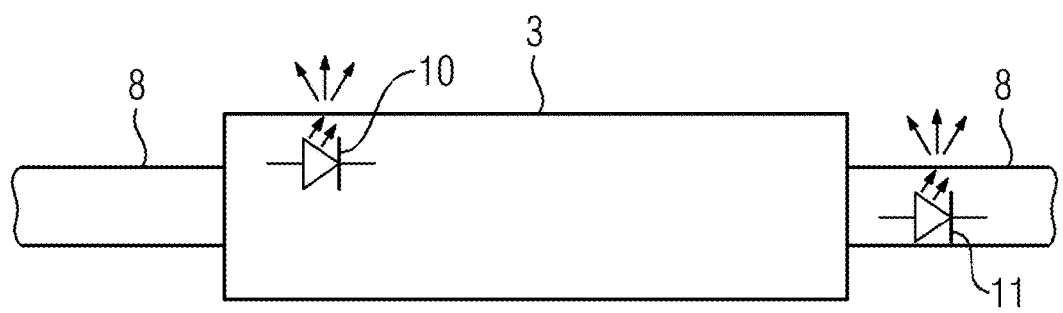
FIG. 6 depicts an example of a lateral cutaway view of a base element of part of two connecting elements respectively.

It is possible for the base elements 3 to include a transparent material in accordance with the illustration in FIG. 6. In this case, light-emitting diodes 10 may be embedded in the base elements 3. In an analogous manner, it is possible for the connecting elements 8 to include a transparent material in accordance with the illustration in FIG. 6. In this case, light-emitting diodes 11 may be embedded in the connecting elements 8.

In summary, the present disclosure relates to the following facts:

A local coil array for magnetic resonance applications has a mechanical structure 1 in which a plurality of local coils 2 of the local coil array are arranged. The mechanical structure 1 has base elements 3 and connecting elements 8. In each case, two of the base elements 3 are connected to one another via at least one connecting element 8 in such a way that a translational and/or rotational movement of the base elements 3 relative to one another is possible to a limited extent. The connection of the base elements 3 to the connecting elements 8 is configured in such a manner that the connecting elements 8 either do not oppose the movement of the base elements 3 relative to one another or only employ such a low counterforce that when the mechanical structure 1 is placed on a patient 9 from above, the base elements 3 come to rest on the patient 9 while moving relative to one another. At least some of the base elements 3 each contain at least a part of one of the local coils 2 of the local coil array.

The present disclosure has many advantages. In particular, the base elements 3 may be configured to be sufficiently heavy and the connecting elements 8 to be sufficiently flexible to enable the mechanical structure 1 to fit closely against the patient 9 by dint of its own weight alone. By distributing the weight to the base elements 3, however, locally uncomfortable loads on the patient 9 may be avoided. Tension straps and belts for fixing the local coil array are not required. The conductor structures which support the local coils 2 may be configured, for example, as flexible printed circuit boards. They may also be realized by an insulated wire made of stranded wire. A bending of the base elements 3 is not required as the connecting elements 8 bring about the required flexibility. The base elements 3 also provide the required installation space for accommodating the electronics of the local coils 2.

Although the disclosure has been illustrated and described in detail by the exemplary embodiments, the disclosure is not restricted by the disclosed examples and the person skilled in the art may derive other variations from this without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A local coil array for magnetic resonance applications, the local coil array comprising: a mechanical structure having base elements and connecting elements; and a plurality of local coils arranged on the mechanical structure, wherein, in each case, two of the base elements are connected to one another via at least one connecting element such that one or both of a translational movement or a rotational movement of the base elements relative to one another is possible, wherein the respective connection of the base elements to the at least one connecting element is configured such that the at least one connecting element either allows for the translational and/or rotational movement of the base elements relative to one another or employs a counterforce that, when the mechanical structure is placed on a patient from above, the base elements come to rest on the patient while moving relative to one another, and wherein at least some of the base elements comprise at least a part of a local coil of the plurality of local coils.

2. The local coil array of claim 1, wherein at least one local coil of the plurality of local coils is arranged in a single base element of the base elements.

3. The local coil array of claim 2, wherein the base elements are flat elements with abutting edges, and
wherein the base elements are adjacent to one another at their abutting edges such that each base element has at least one abutting edge directly opposite an abutting edge of another base element.

4. The local coil array of claim 3, wherein the base elements form a plurality of rows,
wherein each row of the plurality of rows extends in a row direction that is uniform for the plurality of rows,
wherein, within each respective row, the base elements are arranged transversely to the row direction without lateral offset and are only spaced apart from one another by at least one connecting element of the connecting elements,
wherein the base elements are opposite one another from row to row either without an offset in the row direction or are arranged with an offset in a gap, and
wherein the base elements, viewed from row to row, are spaced apart from one another by a further portion of the connecting elements.

5. The local coil array of claim 1, wherein at least one local coil of the plurality of local coils is arranged in at least two base elements and the at least one connecting element connecting the respective base elements to one another.

6. The local coil array of claim 5, wherein the respective base elements and the connecting elements are matched to one another such that a maximum distance of adjacent base elements from one another is at most 10 mm.

7. The local coil array of claim 1, wherein the base elements are flat elements with abutting edges, and
wherein the base elements are adjacent to one another at their abutting edges such that each base element has at least one abutting edge directly opposite an abutting edge of another base element.

8. The local coil array of claim 7, wherein the base elements form a plurality of rows,
wherein each row of the plurality of rows extends in a row direction that is uniform for the plurality of rows,
wherein, within each respective row, the base elements are arranged transversely to the row direction without lateral offset and are only spaced apart from one another by at least one connecting element of the connecting elements,
wherein the base elements are opposite one another from row to row either without an offset in the row direction or are arranged with an offset in a gap, and
wherein the base elements, viewed from row to row, are spaced apart from one another by a further portion of the connecting elements.

9. The local coil array of claim 1, wherein the base elements are flat elements with abutting edges, and
wherein the base elements are adjacent to one another at their abutting edges such that each base element has at least one abutting edge directly opposite an abutting edge of another base element.

10. The local coil array of claim 9, wherein the base elements form a plurality of rows,
wherein each row of the plurality of rows extends in a row direction that is uniform for the plurality of rows,
wherein, within each respective row, the base elements are arranged transversely to the row direction without lateral offset and are only spaced apart from one another by at least one connecting element of the connecting elements,
wherein the base elements are opposite one another from row to row either without an offset in the row direction or are arranged with an offset in a gap, and
wherein the base elements, viewed from row to row, are spaced apart from one another by a further portion of the connecting elements.

11. The local coil array of claim 1, wherein the base elements form a plurality of rows,
wherein each row of the plurality of rows extends in a row direction that is uniform for the plurality of rows,
wherein, within each respective row, the base elements are arranged without lateral offset transversely to the row direction and are spaced at a distance from one another that is greater than a longitudinal extension of the base elements in the row direction, wherein the base elements of adjacent rows are arranged with an offset in a gap when viewed in the row direction, wherein, viewed transversely to the row direction, a row of the plurality of rows is at a distance from the respective next adjacent row but one, which is smaller than a transverse extension of the base elements transversely to the row direction, and wherein the connecting elements connect base elements of adjacent rows to each other in each case.

12. The local coil array of claim 1, wherein the base elements, the connecting elements, or both the base elements and the connecting elements comprise a transparent material.

13. The local coil array of claim 12, wherein light-emitting diodes are embedded in the base elements, the connecting elements, or both the base elements and the connecting elements.

14. The local coil array of claim 1, wherein the plurality of local coils is in a range of 4 and 80 local coils.

15. The local coil array of claim 1, wherein the base elements comprise at least eight base elements, and
wherein at least two of the eight base elements comprise at least a part of one local coil of the plurality of local coils.

16. The local coil array of claim 1, wherein base elements connected to one another via the at least one connecting element are spaced apart from one another via the at least one connecting element.

17. A local coil array for magnetic resonance applications, the local coil array comprising: a mechanical structure having base elements and connecting elements, and a plurality of local coils arranged on the mechanical structure, wherein, in each case, two of the base elements are connected to one another via at least one connecting element such that one or both of a translational movement or a rotational movement of the base elements relative to one another is possible, wherein the respective connection of the base elements to the at least one connecting element is configured such that the at least one connecting element either allows for the translational and/or rotational movement of the base elements relative to one another or employs a counterforce that, when the mechanical structure is placed on a patient from above, the base elements come to rest on the patient while moving relative to one another, and wherein at least some of the base elements comprise at least a part of a local coil of the plurality of local coils, wherein the base elements, the connecting elements, or both the base elements and the connecting elements are inherently stable or rigid, have a foam casing, are configured as flexible covers filled with a gel or a liquid, or a combination thereof.

18. The local coil array of claim 17, wherein the base elements, the connecting elements, or both the base elements and the connecting elements comprise a transparent material.

19. The local coil array of claim 18, wherein light-emitting diodes are embedded in the base elements, the connecting elements, or both the base elements and the connecting elements.

* * * * *